United States Patent
Gutman et al.

(10) Patent No.: US 9,379,194 B2
(45) Date of Patent: Jun. 28, 2016

(54) FLOATING GATE NVM WITH LOW-MOISTURE-CONTENT OXIDE CAP LAYER

(71) Applicant: Tower Semiconductor Ltd., Midgal Haemek (IL)

(72) Inventors: Micha Gutman, Haifa (IL); Yakov Roizin, Afula (IL); Allon Parag, Ramat Ishai (IL); Vladislav Dayan, Nazareth Illit (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 14/536,647

(22) Filed: Nov. 9, 2014

(65) Prior Publication Data

US 2016/0133713 A1 May 12, 2016

(51) Int. Cl.
| | |
|---|---|
| *H01L 29/423* | (2006.01) |
| *H01L 29/788* | (2006.01) |
| *H01L 29/66* | (2006.01) |
| *H01L 29/04* | (2006.01) |
| *H01L 27/148* | (2006.01) |
| *H01L 27/146* | (2006.01) |
| *H01L 27/115* | (2006.01) |
| *H01L 21/28* | (2006.01) |
| *H01L 21/285* | (2006.01) |

(52) U.S. Cl.
CPC ........ *H01L 29/42324* (2013.01); *H01L 21/285* (2013.01); *H01L 21/28273* (2013.01); *H01L 27/11521* (2013.01); *H01L 27/148* (2013.01); *H01L 27/14643* (2013.01); *H01L 29/04* (2013.01); *H01L 29/66825* (2013.01); *H01L 29/788* (2013.01)

(58) Field of Classification Search
CPC combination set(s) only.
See application file for complete search history.

(56) References Cited

U.S. PATENT DOCUMENTS

| | | | |
|---|---|---|---|
| 4,952,523 | A | 8/1990 | Fujii |
| 5,094,984 | A | 3/1992 | Liu et al. |
| 5,139,971 | A | 8/1992 | Giridhar et al. |

(Continued)

OTHER PUBLICATIONS

Burt, D., "Improving Radiation Tolerance in e2v CCD Sensors", Proceedings SPIE 7439, 2009, p ??.

(Continued)

*Primary Examiner* — Mohammad Islam
*Assistant Examiner* — Ratisha Mehta
(74) *Attorney, Agent, or Firm* — Bever, Hoffman & Harms, LLP

(57) ABSTRACT

A back-end metallization structure for non-volatile memory (NVM) and other semiconductor devices including low-moisture-content oxide cap layers that suppress the creation and migration of mobile hydrogen atoms/ions during back-end processing. The metallization structure includes multiple metallization layers formed over front-end e.g., polysilicon (floating gate) structures and a pre-metal dielectric layer. Each metallization layer includes a patterned metal (e.g., aluminum) structure covered by an interlevel dielectric (ILD) layer (e.g., BPSG, USG or FSG). Each cap layer is formed using a high-density low-moisture content oxide such as silane oxide (i.e., $SiO_2$ generated by way of a silane CVD process) that is deposited over the ILD layer in lower metallization layers to serve as an etch-stop for the subsequently-formed metal layer, and to isolate the ILD material from the plasma environment during aluminum over etch, which significantly reduces the production and migration of hydrogen that diminishes charge storage by the floating gates.

10 Claims, 4 Drawing Sheets

(56) References Cited

U.S. PATENT DOCUMENTS

| | | |
|---|---|---|
| 5,716,891 A | 2/1998 | Kodama |
| 6,071,784 A | 6/2000 | Mehta et al. |
| 6,071,802 A * | 6/2000 | Ban ................... H01L 27/10894 257/E21.648 |
| 6,130,172 A | 10/2000 | Fuller et al. |
| 6,524,911 B1 | 2/2003 | Mehta |
| 6,803,266 B2 | 10/2004 | Solomon et al. |
| 8,415,256 B1 | 4/2013 | Nickel |
| 2001/0001075 A1 | 5/2001 | Ngo et al. |
| 2003/0002658 A1 | 1/2003 | Belge et al. |
| 2005/0006693 A1 | 1/2005 | Ngo et al. |
| 2005/0145931 A1 * | 7/2005 | Lee ................... H01L 29/6659 257/327 |
| 2007/0170546 A1 * | 7/2007 | Beach ................... H01L 27/016 257/532 |
| 2010/0078778 A1 * | 4/2010 | Barth ................... H01L 21/568 257/659 |
| 2011/0206857 A1 | 8/2011 | Yim |
| 2011/0312191 A1 | 12/2011 | Ohkura |
| 2012/0161255 A1 | 6/2012 | Gabert |
| 2012/0175736 A1 * | 7/2012 | Watanabe ........... H01L 23/5223 257/532 |
| 2013/0092929 A1 * | 4/2013 | Okazaki .............. H01L 29/7869 257/43 |
| 2013/0337650 A1 * | 12/2013 | Lee ................... H01L 21/302 438/702 |

OTHER PUBLICATIONS

Dryer, Ben, et al., "Gamma Radiation Damage Study of 0.18 μm CMOS Image Sensors", Proceedings of SPIE vol. 7742 77420E-1, 2010, 8 pages.

* cited by examiner

FLOATING GATE NVM WITH LOW-MOISTURE-CONTENT OXIDE CAP LAYER

FIELD OF THE INVENTION

This invention relates to semiconductor integrated circuit (IC) devices, and more particularly to a back-end structure for use in fabricating IC devices including non-volatile memory (NVM).

BACKGROUND OF THE INVENTION

Semiconductor device fabrication is the process used to create the integrated circuits (ICs) that are present in everyday electrical and electronic devices, and involves a multiple-step sequence of photolithographic and chemical processing steps during which electronic circuits are gradually created on a wafer made of pure semiconducting material (typically monocrystalline silicon). Modern integrated circuits are produced using, e.g., CMOS production flows (standardized processing sequences) including over 300 sequenced processing steps that are generally divided into Front-end-of-line (front-end) processes and Back-end-of-line (back-end) processes. Front end processing typically involves implanting dopants in the silicon wafer and depositing materials on the substrate that collectively form individual device components (e.g., transistors, capacitors, resistors, etc.). For example, front end processing for a non-volatile memory (NVM) transistor typically involves implanting n-type and p-type dopants into the silicon wafer to form source and drain doped diffusion regions that are disposed in electrically isolated well regions, forming gate oxides and field oxides on the silicon wafer surface, forming polycrystalline silicon (polysilicon) gate structures on the gate oxides, and forming a pre-metal dielectric ("D1" passivation) layer over the polycrystalline gate structures. Back end processing is the second portion of IC fabrication that involves forming a metallization structure including multiple (typically three to eight) metallization layers disposed in a stack, where each metallization layer includes a patterned metal (e.g., aluminum) "wire" layer and an interlevel dielectric (ILD) layer that serves to electrically isolate the patterned metal wires from the subsequently formed patterned metal wires of the next sequential metallization layer in the stack. The patterned metal wires of the various metallization layers interconnect the individual device components by way of metal "via" structures that are formed in conjunction with a contact etch process and extend through the pre-metal dielectric layer and previously formed ILD layers. The last (uppermost) patterned metal layer is covered by a final "topside stack" insulating material layer that is patterned by way of a "pad etch" process to make appropriate connections to the underlying IC, typically by way of connections to the uppermost patterned metal structure).

The ILD and topside stack are typically formed using one or more of Undoped silicate glass (USG), Fluorosilicate glass (FSG) and Borophosphosilicate glass (BPSG). A principal component of USG, FSG and BPSG is silicon dioxide ($SiO_2$), which is commonly used as dielectric material in semiconductor processing, where USG is essentially "pure" $SiO_2$, FSG is essentially $SiO_2$ containing fluorine, and BPSG is $SiO_2$ including both boron and phosphorous. Silicon dioxide ($SiO_2$) and silicon nitride ($Si_3N_4$, referred to as SiN for brevity herein) are the two prevalent dielectric material used in semiconductor processing. However, since the dielectric constant of silicon dioxide, which is about 3.9, is lower than that of silicon nitride, which is about 7.5, silicon dioxide is usually preferred for use as an insulation material between active regions or conductive lines, such the patterned metal layer found in back-end metallization structures. Two prevalent reactive gases used for forming silicon dioxide by chemical vapor deposition (CVD), which is commonly used in semiconductor processing, are silicon hydride (silane, $SiH_4$) and tetra-ethyl-ortho-silicate, (TEOS, $Si(OC_2H_5)_4$). Because the step coverage (gap filling) ability of $SiO_2$ formed using TEOS (referred to herein as "TEOS-based oxide") is better than SiO2 formed using silane (referred to herein as "silane oxide"), TEOS-based oxide is preferred in semiconductor manufacture. TEOS and ozone ($O_3$) are sometimes used together as reactive gases in an atmospheric-pressure chemical vapor deposition (APCVD) for depositing USG to form shallow trench isolation (STI), inter-poly dielectrics (IPD) or cap layers on inter-level dielectric (ILD) layers in back-end structures.

The importance of hydrogen for the performance of CMOS devices is well known in semiconductor industry. A certain amount of hydrogen at the Silicon-Gate Oxide interface is needed to passivate the surface states (by forming Si—H complexes with dangling bonds). At the same time, excess amounts of hydrogen are responsible for device instabilities. For example, excess hydrogen may result in floating gate memory retention loss (e.g., hydrogen ions discharging single polycrystalline silicon ("single-Poly") floating gate memories; see U.S. Pat. No. 6,130,172, "Radiation hardened dielectric for EEPROM", R. Fuller et. al., which teaches that higher radiation hardness of BPSG with lower amounts of hydrogen was associated with lower amount of hole traps associated with hydrogen complexes). Briefly, a problem with semiconductor devices including NVM cells (i.e., erasable and programmable read only memories (EPROM), flash memories, and electrically erasable programmable read only memories (EEPROMs)) that are fabricated using conventional semiconductor fabrication techniques is that front-end NVM structures (specifically the floating gates) may be detrimentally affected by hydrogen ions that are generated during the back-end process, and then migrate/diffuse toward the front-end structures, especially at high temperatures, where the act to reduce the amount of charge that can be stored on the floating gate structures. Hydrogen atoms are also known to interact with the bulk silicon defects created by ionizing radiation. For example, N. Shlopak, et. al. Physica Status Solidi, Volume 137, Issue 1, pages 165-171, 1993, teaches that preliminary treatment of silicon in hydrogen plasma leads to a significant increase in radiation hardening. It was assumed that passivation of deep radiation defects occurred due to radiation activated hydrogen originating from inactive hydrogen containing species. Thus, the necessity to control the generation and migration of hydrogen atoms/ions and other ions generated during back-end processing is well known in the industry.

An early approach to controlling the generation/migration of hydrogen generated during back-end processing is to form a gettering/barrier layer on the pre-metal dielectric layer that serves to protect the underlying transistors and other IC elements before beginning back-end processing. Typical gettering materials include phosphosilicate glass (PSG) and BPSG. In addition, a layer of silicon nitride or silicon oxy-nitride is typically formed under the PSG or BPSG that serves as an etch stop during contact etch, and also contributes to the performance of the gettering/barrier layer. However, a problem with the gettering/barrier layer solution is that mobile hydrogen atoms are known to penetrate the gettering/barrier layer and diffuse to the floating gate of NVM devices, thus reducing floating gate storage capacity and causing reduced device operating parameters.

In order to prevent mobile atoms from affecting characteristics of the MOS transistors or memory cells, Mehta et al. (U.S. Pat. No. 6,071,784) provides a method of annealing the silicon nitride (SiN) layer and silicon oxy-nitride layer so as to eliminate charge loss from non-volatile memory devices. This approach involves forming a barrier layer or an etch stop layer that covers the MOS device/FG structure, and then high temperature annealing at 750° C. is used to remove mobile atoms from the barrier layer or the etch stop layer. An additional dielectric layer is then formed on the barrier layer or the etch stop layer to protect the dehydrated barrier layer from moisture re-absorption. However, a disadvantage of this process is the addition of an extra high-temperature annealing process during the semiconductor fabrication process (especially in embedded processes) because the additional thermal budget alters the characteristics of semiconductor elements. In addition, this process does not account for the possibility that mobile hydrogen atoms and mobile ions may be re-adsorbed into the barrier layer, or may migrate/diffuse to the semiconductor elements under the barrier layer through the contact holes.

Tseng et al. (US. Pat. Application 20030003658) addresses some of the shortcoming mentioned above by providing a fabrication method for NVM devices that involes effectively preventing diffusion of the mobile ions or the hydrogen atoms into the memory device barrier by forming a spacer on the sidewall of the contact hole. This solution, however, has a disadvantage in that it adds a large number of process steps to the process flow, which greatly increases overall IC fabrication costs. In addition, the effect of the additional spacers on the reliability of the contact is questionable. Further, other penetration paths for hydrogen atoms/ions (e.g., diffusion through the gettering/barrier layer) are not addressed by this solution.

Additional proposed solutions to minimizing hydrogen atom/ion migration damage include methodologies for decreasing the amount of hydrogen or moisture contained in back-side materials, thus minimizing hydrogen atom/ion generation during back-side processing. One approach utilizes a "reflow" bake to achieve "silane oxide" protection quality using a modified "TEOS-based oxide" in BPSG formation, but this approach cannot be used in CMOS process flows involving Salicide formation, and adds a high thermal budget. Other proposed solutions require too many additional steps to be added to a typical CMOS process flow (i.e., the resulting added cost and possible effect on the CMOS platform are major drawbacks), and the retention improvement is considered by the inventors to be unsatisfactory. Other proposed solutions claim charge retention improvement from the use of optimized SiN etch stop layers, but the present inventors determined that even optimized SiN adds another source of H+ ions, and even a "perfect" optimized SiN etch stop layer would not sufficiently curtail the generation/migration of back-end-generated ions. Other solutions propose improving the quality of the TEOS-based oxide used to form the first interlayer dielectric (ILD-1) by adding a gettering/barrier layer (e.g., BPSG, SiN, etc.), but the present inventors determined that these solutions have limited effectiveness because the H+ ions source is not limited to the ILD-1 layer, but rather related to the ILD layers of every metallization layer of the metallization structure stack. In summary, based on extensive research, the present inventors concluded none of the prior art solutions mentioned above serve to adequately reduce or eliminate the migration of back-end-generated hydrogen atoms/ions into front-end structures (e.g., polysilicon structures or doped diffusion regions), particularly H+ ions generated by back-end processing involving aluminum interactions with residual moisture disposed in ILD layers.

What is needed is a modified back-end processing methodology and modified back-end metallization structure that suppresses both the creation and migration of mobile hydrogen atoms/ions, thus improving a semiconductor device's operating performance (e.g., improving data retention in the NVM cells).

SUMMARY OF THE INVENTION

The present invention is directed to a back-end metallization structure for semiconductor integrated circuit (IC) devices, and especially IC devices including non-volatile memory (NVM) arrays (e.g., a CMOS system-on-chip (SOC) device including one or more embedded NVM arrays), wherein at least one metallization layer of the back-end metallization structure is modified to include a cap layer that is formed using a high-density low-moisture content oxide material (e.g., silane oxide or silicon oxy-nitride) and disposed over a standard (e.g., TEOS-based oxide) inter-level dielectric (ILD) material in order to suppress the creation and migration of mobile hydrogen atoms/ions, thus improving the IC device's operating performance (i.e., improving data retention by the NVM cells). Similar to conventional CMOS devices, the modified "back-end" metallization structure includes multiple metallization layers that are sequentially formed after "front-end" processing is completed using known CMOS techniques (i.e., after source/drain regions are diffused into a semiconductor substrate, gate oxides are deposited, doped polycrystalline silicon structures that form, e.g., the floating gate of NVM cells are formed over the substrate surface, a pre-metal dielectric ("D1" passivation) layer is formed over the doped polycrystalline silicon structures, and metal via structures are formed through the pre-metal dielectric layer to corresponding diffusions or other structures). As with conventional back-end metallization, the modified back-end metallization structure of the present invention includes multiple metallization layers formed in a stack, where each metallization layer includes a patterned metal (typically aluminum) layer and a TEOS-based oxide ILD layer formed over the patterned metal/aluminum layer. According to an aspect of the invention, at least one of the lower metallization layers (i.e., either the lowermost "M1" metallization layer or any subsequent metallization layer other than the uppermost/last metallization layer) includes a cap layer formed on an upper surface of the ILD layer and comprises a high-density low-moisture content oxide having a density of 2.2 g/cm$^3$ or greater and a maximum moisture content of four atomic percent or lower, having a minimum thickness ("critical") thickness of 100 A (or greater). The high-density and low-moisture content oxide material (e.g., silane oxide or silicon oxy-nitride) allows the cap layer(s) to isolate the ILD material from the plasma environment generated during aluminum over-etch, thereby minimizing the production of hydrogen atoms/ions that can migrate toward the polycrystalline silicon (polysilicon) structures and reduce operating performance of the semiconductor device. By implementing the proposed ILD/cap layer structure using materials and processes already present in the fabrication environment (e.g., by forming the cap layer using silane, which is a gas used in most VLSI processes for different purposes, such as dielectrics formation, polysilicon deposition, etc.), the present invention provides a low-cost and highly effective solution to reduced charge retention in NVM cells caused by the migration of back-end-generated hydrogen atoms/ions into front-end structures.

According to an exemplary embodiment, multiple cap layers consisting of high-density low-moisture content oxide are formed on associated ILD or pre-metal dielectric layers consisting of TEOS-based oxide (i.e., one or more of BPSG, USG or FSG). The use of TEOS-based oxides as ILD/pre-metal dielectric materials is well known due to their superior gap-filling characteristics (i.e., conformity to complicated topologies, as compared to that of other oxides, such as silane oxide, SiN and silicon oxy-nitride). The present inventors have determined that, even when TEOS-based oxides are modified to reduce moisture content (e.g., by reacting the TEOS with ozone) and/or subjected to a post-deposition dehydration process (e.g., performing a "densification" bake after deposition), TEOS-based oxides still contain large amounts of moisture that produces hydrogen in charged and neutral states (i.e., atomic hydrogen and hydrogen positively charged ions) during each back-side aluminum etch process. The present inventors also determined that a significant amount of hydrogen (particularly, positive hydrogen ions) generated during every back-side aluminum etch (i.e., not just the "M1" aluminum etch) migrates toward the front-end structures and deteriorates NVM operating performance, and that this hydrogen production is significantly reduced when at least one cap layer consisting of a low moisture oxide, such as silane oxide, is formed over TEOS-based oxide ILD layer in at least one lower metallization layer. In the case of NVM cells, the use of silane oxide cap layers eliminates or reduces the number of charged hydrogen ions that can accumulate near the polysilicon floating gates, thus significantly improving memory retention over conventional back-side processing approaches. Thus, combining a TEOS-based oxide layer and a silane oxide layer in two or more of the metallization layers produces back-end processing characterized by a significant reduction is the generation and migration of hydrogen atoms/ions, and hence improved semiconductor devices. Forming cap layers comprising high-density low-moisture content oxide (e.g., silane oxide) on every lower metallization layer minimizes/eliminates hydrogen generation during all back-side aluminum etch processes, thereby maximizing device operating parameters (e.g., maximizing NVM floating gate storage capacity). However, it is currently believed that a beneficial increase in device operating parameters may be achievable by forming low moisture cap layers in only one or some of the lower metallization layers using one or a few silane oxide cap layers, whereby hydrogen production during aluminum etch is reduced (i.e., in comparison to conventional arrangements that do not utilize low moisture oxide cap layers). As such, in an optional embodiment, one or more (first) cap layers may be formed using another oxide material, such as a TEOS-based oxide generated by way of reacting TEOS ($Si(OC_2H_5)_4$) gas and ozone ($O_3$) gas, so long as at least one (second) cap layer of another metallization layer comprises a high-density low-moisture content oxide (e.g., silane oxide).

According to yet another alternative practical embodiment, an additional cap layer comprising the high-density low-moisture content oxide (e.g., silane oxide) is formed on the pre-metal dielectric layer (i.e., between the pre-metal dielectric layer and the lowermost metallization layer) in order to further minimize hydrogen production and migration into the front-end structures. Alternatively, or in addition to the additional cap layer, an optional barrier layer (e.g., silicon nitride or silicon oxy-nitride having a thickness in the range 200-500 A) is formed above (over), below (under) or sandwiched inside the BPSG or other TEOS-based oxide material forming a bulk of the pre-metal dielectric layer, which further minimizes hydrogen migration into the front-end structures.

According to another practical embodiment, each low-moisture (e.g., silane oxide) cap layer is formed with an initial (i.e., maximum) thickness determined in accordance with the aluminum over-etch penetration depth of the modified CMOS fabrication flow in order to produce a minimum thickness of 100 A (100 Angstroms) or greater (i.e., such that the cap layer forms an unbroken barrier after a subsequently formed aluminum layer is etched, thereby reducing or preventing hydrogen migration into the underlying ILD material). In a practical embodiment, the ILD material (e.g., TEOS/FSG) is deposited over a previously patterned metal structure and planarized by CMP, then the cap layer is deposited on the ILD layer, and then the aluminum layer of a next-sequential metallization layer is deposited over the cap layer and patterned using known techniques that involve etching a predetermined over-etch distance (penetration depth) into the cap layer to assure complete removal of aluminum. Because the main purpose of the cap layer is to isolate the ILD layer from the plasma environment generated during aluminum over-etch, it is critically important to form the cap layer with an initial thickness such that the etch front stops in the cap layer, thereby minimizing/preventing hydrogen production caused by the reaction between residual moisture/hydrogen in the ILD layer and aluminum. That is, if the cap layer thickness is too small and the etch-front approaches/reaches the underlying ILD layer, the generation of hydrogen significantly increases. According to a practical embodiment, forming the cap layer with an initial thickness in the range of 500 A-5000 A provides a sufficient buffer for the aluminum over-etch penetration depths utilized in standard CMOS process flows.

The present invention is directed to a modified back-end processing method for use in the fabrication of semiconductor integrated circuits (ICs), and in particular to the fabrication of non-volatile memory devices, that facilitates control over the amount of generated hydrogen by significantly reducing or eliminating hydrogen production during the formation of at least one metallization layer of the back-end metallization structure. According to the present invention, the amount of hydrogen atoms/ions produced during back-end processing is controlled by forming at least one lower metallization layer including, first, forming an inter-level dielectric (ILD) layer consisting of a TEOS-based oxide (e.g., one or more of USG or FSG), and then forming a cap layer over the ILD layer comprising either silane oxide or silicon oxy-nitride that serves both as a moisture blocking layer and as an etch-stop for subsequent aluminum over-etch (i.e., such that, after subsequent aluminum etch is completed, at least a portion of the cap layer material, preferably having a minimum "critical" thickness of 100 A (100 Angstroms) or greater, is retained over all portions of the underlying ILD layer. Specifically, at least one of the lower metallization layers (i.e., either the lowermost "M1" metallization layer or any subsequent metallization layer other than the uppermost/last metallization layer) includes a ILD layer consisting of TEOS-based oxide and a cap layer formed on an upper surface of the TEOS-based oxide ILD layer that comprises either high-density, low-moisture content silane oxide or high-density, low-moisture content silicon oxy-nitride. The use of TEOS-based oxide to form the ILD layer assures superior coverage of underlying metallization structures due to its excellent gap filling characteristics. The price of using TEOS-based oxide is porosity and, as a result, higher hydrogen content due to absorbed moisture which is difficult to out-diffuse during typical semiconductor process flows. The cap layer is formed with a thickness greater than the penetration depth of the aluminum etch to prevent exposure of the ILD layer during aluminum over-etch (i.e., such that the etch front terminates at 100 A or greater from the upper surface of the ILD layer), thereby isolating the hydrogen-rich TEOS-based ILD material from the plasma environment generated during aluminum over-etch, whereby production of hydrogen atoms/ions that can migrate toward the front-end structures is minimized. By implementing the proposed ILD/cap layer arrangement in at least one of the metallization layers (or below the first metallization layer) using materials and processes already present in the fabrication environment (e.g., by forming the cap layer using silane, which is a gas used in most VLSI processes for different purposes, such as dielectrics formation, polysilicon deposition, etc.), the present invention provides a low-cost and highly effective method for controlling the creation of mobile hydrogen species and their migration/diffusion to the front end devices.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in back-end processing and to semiconductor integrated circuit devices fabricated with a back-end structure formed by the improved back-end process. The following description is presented to enable one of ordinary skill in the art to make and use the invention as provided in the context of a particular application and its requirements. As used herein, directional terms such as "upper", "uppermost", "lower", and "lowermost" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 4:
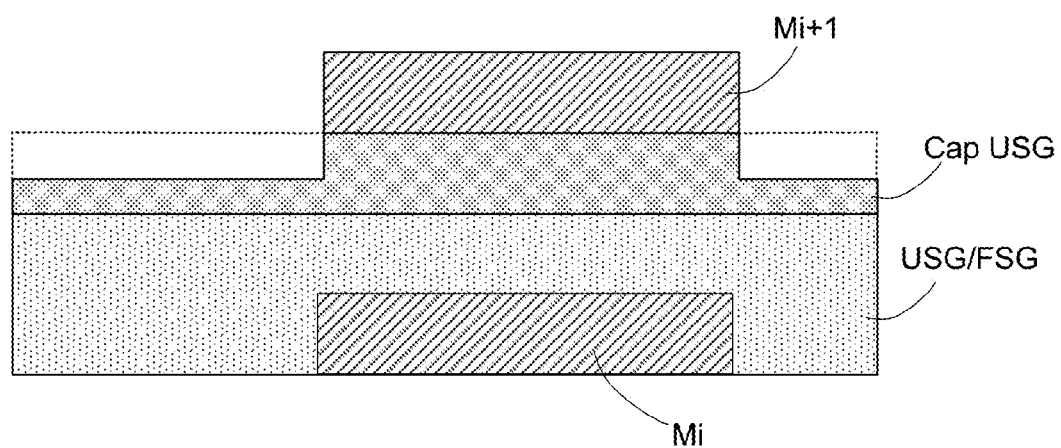
FIG. 4 is simplified cross-sectional diagram showing a metallization layer including a USG-based cap layer.

The present invention is based on research and observations by the present inventors regarding standard CMOS process flows using back-end processing techniques including patterned Aluminum structures and TEOS-based oxide ILD layers. Specifically, the lowermost ILD layer (ILD-1) is formed over an optimized SiN layer and includes TEOS oxide or BPSG, with each subsequent metallization layer including a structure consistent with that shown in FIG. 4: i.e., a patterned aluminum structure Mi covered by a TEOS-based oxide layer USG/FSG (i.e., either USG—i.e., pure TEOS oxide—or FSG). A cap USG layer was formed over the USG/FSG ILD layer by reacting TEOS with ozone, and then a subsequent aluminum layer Mi+1 was formed and patterned (etched) such that the etch front ended in the cap USG layer. The inventors observed that the TEOS-based ILD layer contains large amounts of moisture, and thus generated hydrogen atoms/ions during Aluminum etch. Specifically, the TEOS-based ILD deposition process involves heating the wafer surface to 400° C. and reacting TEOS with oxygen according to the reaction of Equation 1:

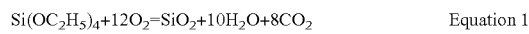

$$Si(OC_2H_5)_4 + 12O_2 = SiO_2 + 10H_2O + 8CO_2 \quad \text{Equation 1}$$

The inventors observed that ILD layers formed using the above TEOS-based oxide process (and even optimized TEOS-based oxides formed using ozone) contain large amounts of moisture (i.e., a significant portion of the "$10H_2O$" in Equation 1 remained in the $SiO_2$), and that this high moisture content generated hydrogen atoms/ions during aluminum over-etch during back-end processing. Further, due to the porous structure of TEOS-based oxides, even if an anneal is performed to remove the moisture, significant moisture returns to TEOS-based oxides during subsequent process stages. The inventors also observed that a significant amount of generated hydrogen migrated to front-end structures during aluminum over-etch in "upper" metallization layers, meaning that the hydrogen generation/migration issue occurs at each metallization layer. Moreover, attempts to reduce the amount of moisture remaining in TEOS-based oxide by baking the ILD material at temperatures of up to 450° C. prior to aluminum deposition were found to be ineffective (i.e., the inventors found this "drying" process leaves residual moisture amounts of up to 10-15% atomic percent in the TEOS-based oxide material). The inventors also observed that the generation of hydrogen atoms/ions during aluminum over-etch was greatly reduced when the ILD layer was formed using a high-density, low-moisture-content oxide material such as high-density low-moisture silane oxide produced by heating the wafer surface to temperatures in the range of 350 to 450° C. and reacting silane with oxygen according to Equation 2:

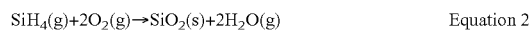

$$SiH_4(g) + 2O_2(g) \rightarrow SiO_2(s) + 2H_2O(g) \quad \text{Equation 2}$$

However, the formation of ILD layers using low-moisture-content oxides is known to be unacceptable due to the poor gap-filling characteristics of known low-moisture-content oxides.

Based on the above observations, the inventors concluded that adequate reduction or elimination of damaging hydrogen atoms/ions during back-end processing can be economically and efficiently achieved when each metallization layer includes both a "lower" ILD layer comprising a TEOS-based oxide (e.g., BPSG, USG or FSG) in order to achieve excellent gap filling, and also a cap layer formed over ILD layer that consists of a high-density low-moisture-content oxide having a minimum "critical" thickness (i.e., 100 A or greater) to prevent exposure of the underlying TEOS-based oxide during aluminum over-etch. As used herein, the phrase "high-density low-moisture content oxide" is defined as an oxide material having a maximum moisture content of four atomic percent or less (e.g., in the range of one to four atomic percent), and a minimum density of 2.2 grams per cubic centimeter ($gm/cm^3$) or greater. In the exemplary embodiments set forth below, a high-density, low moisture silane oxide (i.e., silane oxide produced by heating a wafer surface to temperatures in the range of 350 to 450° C. and reacting silane with oxygen according to Equation 2, above) is primarily utilized to form suitable cap layers. However, unless otherwise specified the phrase "high-density low-moisture content oxide" is not intended to be limited solely to silane oxide, and may include another suitable oxide materials such as high-density, low moisture silicon oxy-nitride (i.e., oxy-nitride formed using a plasma process, e.g., by adding N₂ or NO to silane oxide).

Figure 1:
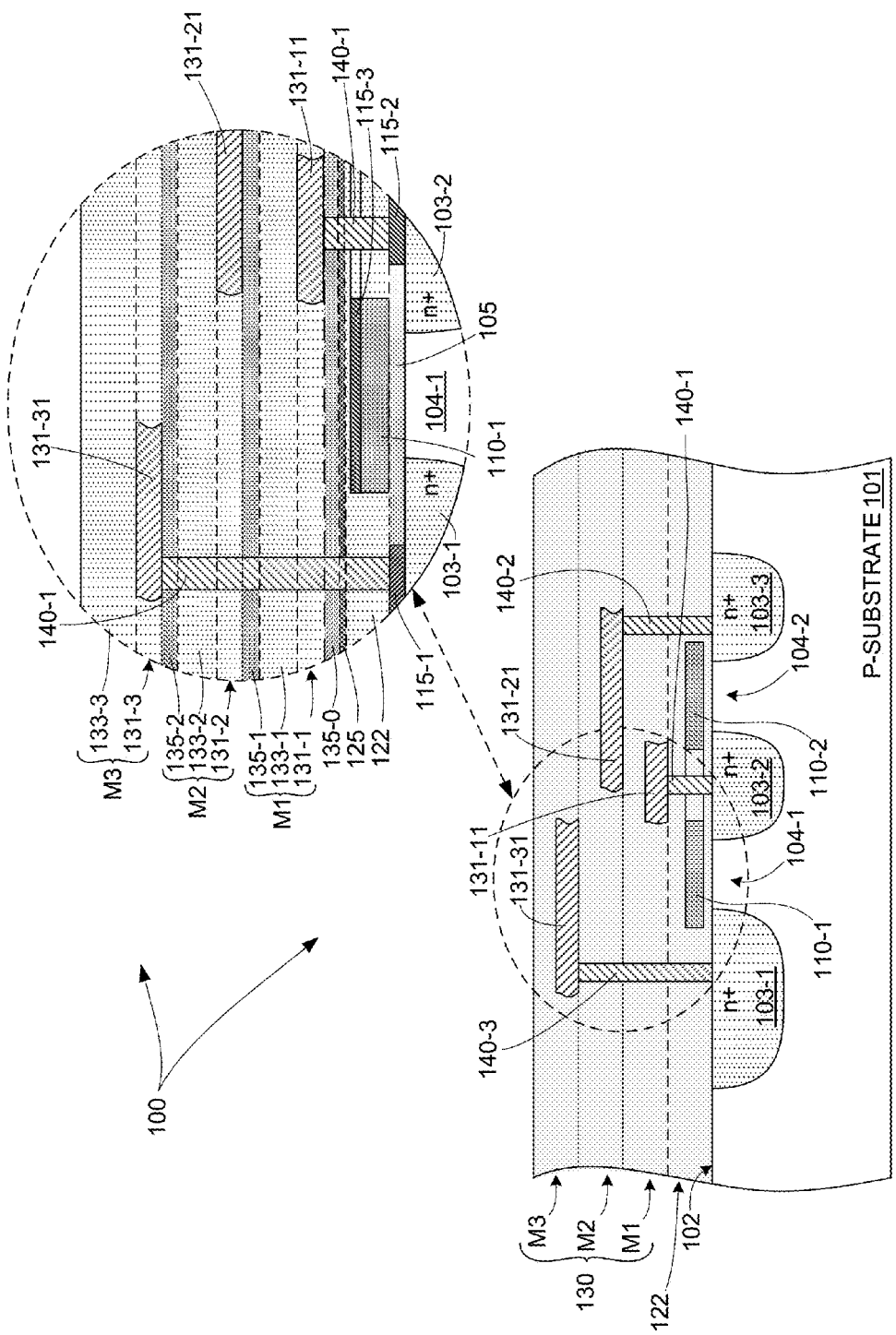
FIG. 1 is a cross-sectional view showing a pixel of an IC including an NVM device according to an embodiment of the present invention in accordance with the method of FIG. 1.

FIG. 1 is a partial cross-sectional view showing a semiconductor device 100 formed on a monocrystalline silicon substrate 101 including doped diffusion regions 103-1 to 103-4 that disposed below an upper substrate surface 102, polycrystalline silicon floating gate structures 110-1 and 110-2 disposed on semiconductor substrate 101 over upper substrate surface 102 (e.g., by way of a gate oxide layer 105 formed therebetween), a pre-metal dielectric ("D1") passivation layer 122 formed over polycrystalline silicon structures 110-1 and 110-2, and a back-end metallization structure 130 formed on pre-metal dielectric layer 122. Similar to conventional arrangements, back-end metallization structure 130 includes three metallization layers M1, M2 and M3 that are sequentially formed in a stack over pre-metal dielectric ("D1") passivation layer 122, and each metallization layer includes a patterned metal layer and a interlevel dielectric (ILD) layer formed over the patterned metal layer. Specifically, metallization layer M1 includes ILD layer 133-1 formed over patterned metal layer 131-1, metallization layer M2 includes ILD layer 133-2 formed over patterned metal layer 131-2, and metallization layer M3 includes ILD layer 133-3 formed over patterned metal layer 131-3.

According to a practical embodiment of the present invention, patterned metal layers 131-1 to 131-3 comprise aluminum that is deposited and etched using known techniques, ILD layers 133-1 and 133-2 of metallization layer M1 and M2 consist of a TEOS-based oxide (e.g., Undoped silicate glass (USG) and Fluorosilicate glass (FGS), or a combination thereof), and cap layers 135-1 and 135-2 of metallization layer M1 and M2 comprise silane oxide (or another high-density low-moisture content oxide). In a preferred embodiment, after forming each ILD layer, industry well known densification methods are utilized to decrease moisture content of the TEOS-based oxide material, and then chemical-mechanical polishing (CMP) is utilized to planarize the upper surface of the TEOS-based oxide. Silane oxide is then deposited to form cap layers 135-1 and 135-2 on ILD layers 133-1 and 133-2, respectively, wherein each cap layer 135-1 and 135-2 has an optimized thickness in the range of 500 A (angstroms) to 5000 A. The combined use of TEOS-based oxide and silane oxide produces a superior ILD structure in that the use of TEOS-based oxide facilitates excellent gap filling over patterned metal structures 131-11 and 131-21, and the use of silane oxide cap layers 135-1 and 135-2 having the optimized thickness were found to significantly reduce the generation and migration of hydrogen atoms/ions into front-end structures.

In the exemplary embodiment, semiconductor device 100 includes a non-volatile memory (NVM) device that forms part of a NVM array. Although the methodology described herein is optimized for NVM devices, the methodology may also be beneficial in the production of other semiconductor devices, such as a contact image sensor, a charge-coupled (CCD) device, or a CMOS-based imaging device. The exemplary NVM device includes a source diffusion region 103-2 and a drain diffusion region 103-1 that are diffused into substrate 101 and separated by a channel region 104-1, polycrystalline silicon floating gate structure portion 110-1 is disposed on a gate oxide layer 105 over channel region 104-1, and salicide structures 115-1 are formed over source diffusion region 103-2, drain diffusion region 103-1, and floating gate structure 110-1. Drain region 103-1 is accessed by way of a patterned aluminum line 131-31 that is disposed in metallization layer M3, an associated via structure 140-3 that extends downward through metallization layers M2 and M1 and pre-metal dielectric 122 to salicide structure 115-1. Source region 103-2 is accessed by way of a patterned aluminum line 131-11 that is disposed in metallization layer M1, an associated via structure 140-1 that extends downward through pre-metal dielectric 122 to salicide structure 115-2. A second program/erase transistor is formed by a third diffusion region 103-3 and polycrystalline silicon floating gate structure portion 110-2 that is disposed over a channel region 104-2, where third region 103-3 is accessed by way of a patterned aluminum line 131-32 that is disposed in metallization layer M2, an associated via structure 140-2 that extends downward through metallization layer M1 and pre-metal dielectric 122. The disclosed NVM device and associated configuration are merely provided to illustrate the present invention in an exemplary context, and are not intended to be either proportionally accurate or limiting to the appended claims unless otherwise specified. In addition, the salicide structures depicted in FIG. 1 are optional, and may be omitted in some embodiments.

Figure 2:
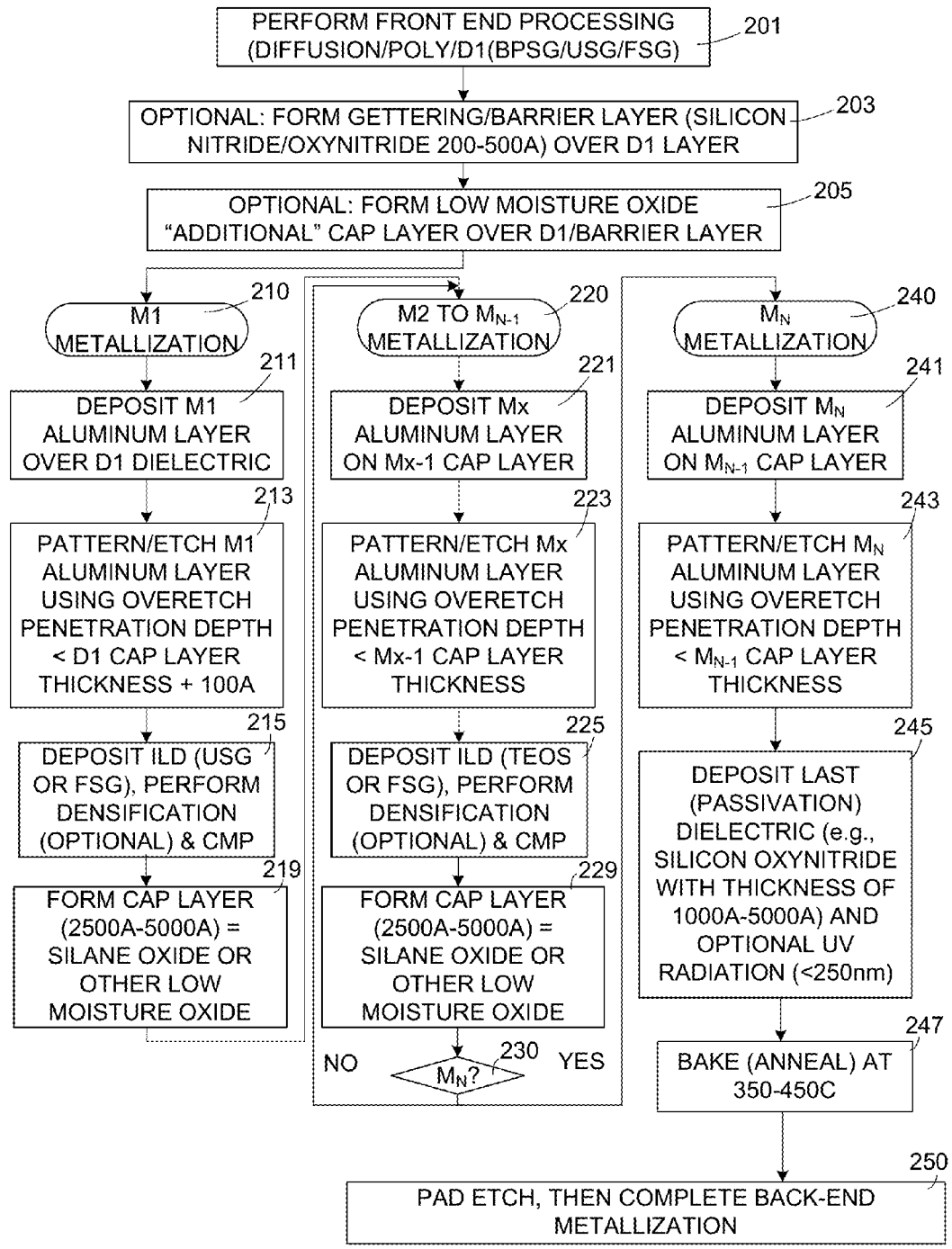
FIG. 2 is a flow diagram showing a method for fabricating the NVM device of FIG. 1.

According to an exemplary embodiment set forth below, the present invention is described with reference to the fabrication of a semiconductor integrated circuit (IC) including an NVM device using a CMOS process flow in which the back-end process is modified to control the amount of hydrogen generated during aluminum over-etch, whereby charge retention by the NVM device is improved by way of utilizing a cap layer consisting of low-moisture-content oxide in at least one of the metallization layers forming the back-end metallization structure. Specifically, FIG. 2 is a flow diagram showing a simplified CMOS process flow including a modified back-end processing method according to an embodiment of the present invention.

The flow diagram of FIG. 2 generally includes front-end processing (block 201) followed by optional pre-metal dielectric processing (blocks 203 and 205), then back-end processing that includes the processes illustrated in the three columns located in the center of FIG. 2, where the left column (i.e., below block 210) including processes associated with generating the lowermost (first, or "M1"), the center column (i.e., below block 220) including processes associated with generating intermediate ("M2 to $M_{N-1}$") metallization layers, and the right column (i.e., below block 240) including processes associated with generating the uppermost/last ("$M_N$") metallization layer. Referring to FIG. 1, structures generated by front-end processing, including pre-metal dielectric ("D1" passivation) layer 122, are disposed in the lower portion of the figure, and back-end processing generates metallization structure 130, which in the exemplary embodiment includes lowermost (first) metallization layer M1, intermediate metallization layer M2, and uppermost (last) metallization layer M3, wherein layers M1 to M3 are sequentially formed in a stack arrangement over pre-metal dielectric layer 122. Similar to conventional back-end processing, each metallization layer M1 to M3 includes a patterned metal structure that is covered by an associated interlevel dielectric (ILD) layer. For example, lowermost metallization layer M1 includes patterned metal structure 131-1 covered by ILD layer 133-1, middle metallization layer M2 includes patterned metal structure 131-2 covered by ILD layer 133-2, and uppermost metallization layer M3 includes patterned aluminum structure 131-3 covered by ILD layer 133-3. According to the exemplary embodiment, patterned metal structures 131-1 to 131-3 comprise aluminum, at least one of ILD layers 133-1 and 133-2 consist of a TEOS-based oxide (e.g., USG and/or FSG), and at least one of cap layers 135-1 and 135-2 consists of silane oxide (or another high-density low-moisture content oxide). In a preferred embodiment, after forming each ILD layer 133-1 and 133-2, industry well known densification methods are utilized to decrease moisture content of the TEOS-based oxide material, and then chemical-mechanical polishing (CMP) is utilized to planarize the upper surface of ILD layers 133-1 and 133-2. Silane oxide is then deposited to form cap layers 135-1 and 135-2 on ILD layers 133-1 and 133-2, respectively, wherein each cap layer 135-1 and 135-2 has an optimized thickness in the range of 500 A (angstroms) to 5000 A. The combined use of TEOS-based oxide and silane oxide produces a superior ILD structure in that the use of TEOS-based oxide facilitates excellent gap filling over patterned metal structures 131-11 and 131-21, and the use of silane oxide cap layers 135-1 and 135-2 having the optimized thickness were found to significantly reduce the generation and migration of hydrogen atoms/ions into front-end structures. Based on the inventor's current understanding, the significant improvement is produced by very low hydrogen generation during aluminum over-etch due to the low moisture content of the silane oxide produced in accordance with Equation 2 (above), because Si—H bonds in silane oxide are a kind of internal getter, and because moisture is not absorbed from the underlying TEOS (i.e., the silane oxide acts as a barrier for moisture). The resulting silane oxide cap layer thus inherently contains significantly less moisture than TEOS-based oxides.

In accordance with an aspect of the present invention, the main purpose of the low-moisture content cap layer differs from that of capping layers found in the prior art. The purpose of the capping layers in the prior art back end integration schemes was to improve the properties of the first dielectric stack which includes BPSG (the layer that is used for gettering). Hence, these conventional capping layers were employed only after gettering/barrier layer. In contrast, the main purpose of the high-density low-moisture content oxide cap layers of the present invention is to isolate the TEOS-based oxide of the ILD layer from the plasma environment during aluminum over-etch. The present inventors observed that it was critically important to adjust the thickness of cap layer thickness to comply with the aluminum over etch penetration depth. If, during the Al over-etch, the etch front stops in the silane oxide of the cap layer with a sufficient "buffer" (i.e., with a minimum critical thickness of silane oxide of 100 A or greater), the amount of hydrogen generated by the reaction between residual moisture/hydrogen and Al) is small. However, if the etch front approaches/reaches the FSG/USG, generation of hydrogen strongly increases. Accordingly, it is a feature of the present invention that cap layers 135-1 and 135-2 have a minimum "critical" thickness (i.e., in regions of the silane oxide that are etched during aluminum over-etch) of 100 A or greater.

The process flow of FIG. 2 will now be described in additional detail with reference to FIGS. 1 and 3(A) to 3(C).

Referring to the upper portion of FIG. 2, the process flow begins with front-end processing (block 201), which generally includes forming doped regions in a semiconductor substrate (wafer), the formation of polycrystalline silicon (polysilicon) gate structures, the generation of salicide structures, and the formation of a pre-metal dielectric ("D1" passivation) layer. Simplified exemplary structures produced during front-end processing are illustrated the lower portion of FIG. 1. For example, doped diffusion regions (e.g., n+ regions 103-1, 103-2 and 103-3) are formed in a p-type semiconductor substrate 101, then polycrystalline silicon structures (e.g., gate structures 110-1 and 110-2) are formed on respective gate oxide structures that are disposed on an upper surface 102 (e.g., as indicated in the bubble at the top of FIG. 1, gate structure 110-1 is formed on gate oxide structure 105), salicide structures are formed on upper surface 102 and on the polycrystalline silicon structures (e.g., as indicated in the bubble at the top of FIG. 1, salicide structures 115-1 and 115-2 are formed over n+ regions 103-1 and 103-2, respectively, and salicide structure 115-3 is formed on gate structure 110-1), and then pre-metal dielectric layer 122 comprising BPSG or other TEOS-based oxide (e.g., USG, FSG, or a combination thereof) having a thickness in the range of 5000 A and 15000 A is deposited over the polysilicon gate structures and upper surface 102 and then planarized. In one embodiment, the front-end processing described above is conducted according to known techniques. The disclosed image device and associated configuration are merely provided to illustrate the present invention in an exemplary context, and are not intended to be limiting. The salicide structures are optional and may be omitted in some embodiments.

Referring to block 203 in FIG. 2 and to the lower portion of FIG. 1, according to an embodiment, an optional gettering/barrier layer 125 is formed on/over dielectric layer 122. In alternative embodiments (not shown), optional gettering/barrier layer 125 is disposed below/under or inside (i.e., in between two layers of material that form) dielectric layer 122. In each of these cases, optional gettering/barrier layer 125 is disposed between polycrystalline silicon structures 110-1 to 110-3 and lowermost metallization layer M1. In an exemplary embodiment, gettering/barrier layer 125 consists essentially of either silicon nitride or silicon oxy-nitride and has a thickness in the range 200-500 A, and serves a purpose similar to that of conventional barrier layers (i.e., resisting the penetration of ions to the front-end devices, and also acting as an etch stop layer during contact etch).

Referring to block 205 in FIG. 2 and to the bubble portion of FIG. 1, according to another embodiment, an "additional" low-moisture oxide cap layer 135-0 is formed over pre-metal dielectric layer 122 (i.e., between pre-metal dielectric layer 122 and lowermost metallization layer M1), and serves the same purpose as that of cap layers 135-1 and 135-2 disposed in the metallization layers (i.e., to minimize hydrogen production during etch of the first aluminum layer 131-1, as described below). In an exemplary embodiment, pre-metal dielectric layer 122 is formed using BPSG, USG and/or FSG, and additional cap layer 135-0 is formed by a layer of silane oxide. As with all subsequent low-moisture oxide cap layers, additional cap layer 135-0 is formed with a sufficient thickness (e.g., with a thickness in the range of 500 A and 5000 A) such that, after "M1" aluminum layer 131-1 is deposited and etched, remaining portions of additional cap layer 135-0 have a minimum thickness of 100 A or greater, thereby preventing exposure of pre-metal dielectric layer 122 to aluminum plasma during the subsequent patterning of aluminum layer 131-1.

Referring to the leftmost column in FIG. 2 (i.e., below block 210), after formation of pre-metal dielectric layer 122 (and optional "additional" cap layer 135-0 and/or barrier layer 125) is completed, formation of lowermost metallization layer M1 begins by depositing the first "M1" aluminum layer on the M1 cap layer (block 211), and then patterning/etching the first aluminum layer (block 213) to form patterned aluminum layer 131-1. ILD layer 133-1 is then formed over patterned aluminum layer 131-1 (block 215), and then cap layer 135-1 is formed (block 219).

Figure 3A:
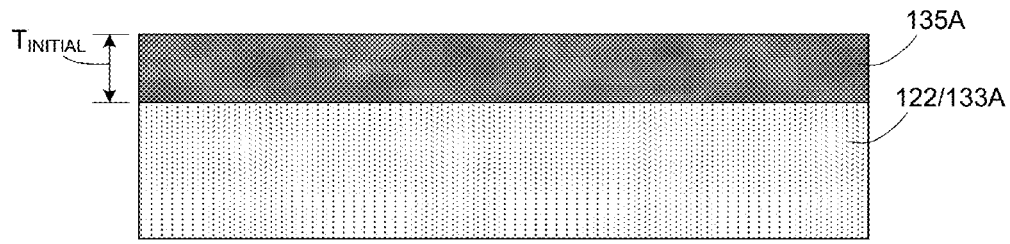
FIGS. 3(A), 3(B) and 3(C) are simplified cross-sectional views showing formation of a metal structure on a cap layer according to the method of FIG. 2.
Figure 3B:
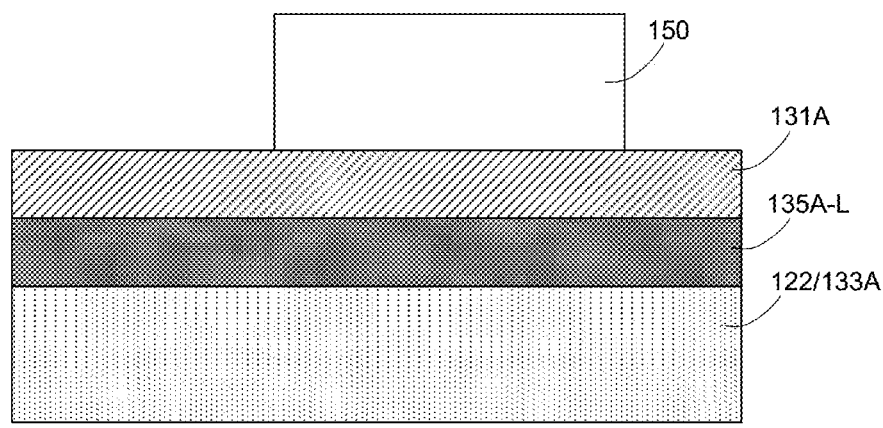
Figure 3C:
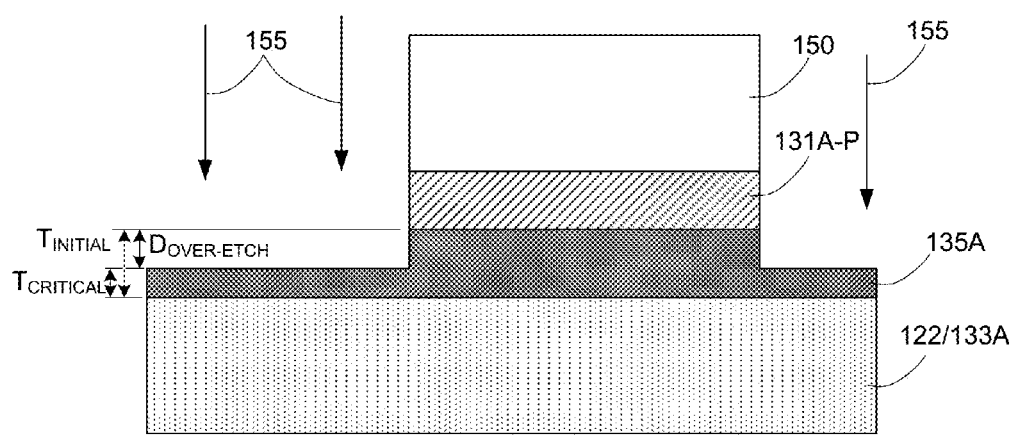

FIGS. 3(A) to 3(C) depict the deposition and patterning of an aluminum layer 131A on a previously formed cap layer 135A according to an exemplary embodiment of the present invention. The process illustrated in FIGS. 3(A) to 3(C) is applicable to the case where first aluminum layer 131-1 is deposited and patterned on "additional" cap layer 135-0 is present on pre-metal dielectric layer 122 (i.e., in this case, the dielectric layer disposed under cap layer 131A is dielectric layer 122), and is also applicable to subsequently deposited/patterned aluminum layers formed on the cap layer of previous metallization layers (e.g., the deposition/patterning of aluminum layer 131-2/131A on cap layer 135-1/135A, which is disposed on ILD layer 133-1/133A).

Referring to FIG. 3(A), metallization layer 131A (e.g., first metallization layer 131-1) is formed by depositing aluminum using known techniques over pre-metal dielectric layer 122 (i.e., on "additional" cap layer 135-0, as indicated in FIG. 1). Cap layer 135A (which in this case represents optional "additional" cap layer 135-0 of FIG. 1) is provided with an initial thickness $T_{INITIAL}$ in the range of 500 A to 5000 A, and is formed over pre-metal dielectric layer 122. As indicated in FIG. 3(B), aluminum layer 131A is then deposited on cap layer 135A, and a mask 150 (e.g., photoresist material) is then deposited and patterned using known techniques. As indicated in FIG. 3(C), exposed portions of aluminum layer 131A are then etched using a suitable etchant 155 according to known techniques to form aluminum metallization structures (e.g., aluminum wires 131-11 and 131-12 shown in FIG. 1). Note that cap layer 135A is formed such that initial thickness $T_{INITIAL}$ is greater than a sum of over-etch penetration distance $D_{OVER-ETCH}$ and a minimum critical thickness $T_{CRITICAL}$ of cap layer 135A. If the etch front penetrates through cap layer 135A to ILD layer 133A, hydrogen is generated due to the reaction of water molecules with aluminum plasma. The generated hydrogen can be in charged and neutral states (atomic hydrogen and hydrogen positively charged ions). Both types of species can diffuse in the direction of the active devices (transistors, resistors, etc. formed in silicon) and change their parameters. In particular, charged positive ions can accumulate near the floating gates of memory devices and effectively decrease the charge on the floating gates (initially programmed, with negative charge in the polysilicon floating gate). The same increased accumulation of hydrogen happens in the peripheral areas of CIS image sensors. By forming cap layer 135A such that, at the end of the aluminum over-etch the etch portion of cap layer 135A retains a minimum critical thickness $T_{CRITICAL}$ of 100 A or greater between the etch front and the upper surface of dielectric/ILD layer 122/133A, the generation of hydrogen atoms/ions is greatly reduced.

Referring to block 215 in FIG. 2, after first patterned metal layer 131-1 is completed, a first ILD (passivation dielectric) layer is formed (ILD layer 133-1 in FIG. 1) by depositing TEOS-based oxide (e.g., USG and/or FSG) having a thickness in the range of 5000 A and 15000 A. According to a specific embodiment, ILD layer 133-1 is then subjected to optional "densification" (annealing), and then planarized using, for example, chemical mechanical polishing (CMP). The densification anneal is performed to remove the residual water from the TEOS-based oxide in order to further reduce hydrogen generation during subsequent aluminum etch.

Referring to block 219 in FIG. 2, first cap layer 135-1 is then formed on ILD layer 133-2, e.g., by forming silane oxide having a thickness in the range of 500 A to 5000 A on first ILD layer 133-1. The silane oxide is generated in accordance with the reaction of Equation 2 (above). Following formation of cap layer 135-1, via formation is performed in accordance with known techniques. For example, to form vertical metal "via" connecting structures 140 that are shown in FIG. 1, a via mask is formed, an etch is performed through the silane oxide to form via openings, the via openings are filled with tungsten, tungsten CMP is performed, then next-layer metal deposition is performed. Note that the thickness of the cap layer is predicated in part on the tungsten etch and CMP.

Referring to the middle column in FIG. 2, after formation of the lowermost "M1" metallization layer is completed, formation of the middle ("M2 to $M_{N-1}$") metallization layer (block 220) begins by depositing the second "M2" aluminum layer on the M1 cap layer (block 221), and then patterning/etching the second aluminum layer using an etch process having an over-etch penetration depth that is less than the cap layer thickness of M1 cap layer (block 223). Referring to FIG. 1, metallization layer M2 forms the middle (intermediate) metallization layer of NVM device 100, and includes patterned aluminum layer 131-2 covered by ILD layer 133-2, and cap layer 135-2 formed on ILD layer 133-2. In the manner described above with reference to FIGS. 3(A) to 3(C), metallization layer 131-2 is formed by depositing aluminum on cap layer 135-1 of metallization layer M1, and then etching the aluminum layer to form aluminum metallization structures (e.g., aluminum wires 131-21 and 131-22) using an etch process that does not penetrate through cap layer 135-1. Referring to block 225 in FIG. 2, after the second patterned metal layer is completed, a second ILD (passivation dielectric) layer is formed (ILD layer 133-2 in FIG. 1) by depositing TEOS-based oxide (e.g., USG and/or FSG) having a thickness in the range of 5000 A to 15000 A, followed by optional densification and planarization by CMP. Next, a second cap layer 135-2 is formed on ILD layer 133-2, e.g., by forming silane oxide having a thickness in the range of 500 A to 5000 A, preferably in the range of 2500 A to 5000 A. Following formation of cap layer 135-2, via formation is performed in the manner described above followed by tungsten CMP.

Referring again to blocks 219 and 229 in FIG. 2, in accordance with alternative embodiments, one or more of the first "M1" metallization layer or the intermediate metallization layers is optionally formed using TEOS-based oxide in order to "tune" the amount of hydrogen generated during back-end processing. That is, in cases where the generation of hydrogen is to be minimized in order to maximize device operating parameters (e.g., in order to maximize NVM floating gate storage capacity), all of the lower cap layers (e.g., both cap layer 135-1 and 135-2 in the example of FIG. 1) are formed using silane oxide in order to minimize hydrogen generation/migration. However, in some cases the formation of one or a few cap layers in some (but not all) of the lower metallization layers may provide sufficient beneficial improvement in the charge retention of NVM devices, whereby the formation of cap layers in blocks 219 and 229 are considered optional. For example, referring to FIG. 1, cap layer 135-1 of metallization layer M1 may be formed using an STI-type TEOS-based oxide (e.g., generated by way of reacting TEOS ($Si(OC_2H_5)_4$) gas and ozone ($O_3$) gas), whereas cap layer 135-2 of said second metallization layer M2 comprises silane oxide.

Referring to lower portion of the middle column in FIG. 2, after completing the formation of an intermediate metallization layer (including via etch/formation), the process of blocks 221 to 229 is repeated for each additional intermediate metallization layer (i.e., "NO" branch of decision block 230), if any additional metallization layers are present in the back-end structure. In three-layer metallization structure 130 illustrated in FIG. 1, only one intermediate metallization layer (i.e., layer M2) is formed, so blocks 221 to 229 are performed only once. In other embodiments including four or more metallization layers, blocks 221 to 229 are repeated for each metallization layer disposed between the first (lowermost) and last uppermost) metallization layers.

Referring to the right side of FIG. 2, after all intermediate metallization layers are formed (i.e., "YES" branch of decision block 230), formation of the uppermost/last "$M_N$" metallization layer (block 240) begins by depositing the last "$M_N$" aluminum layer on the second-to-last "$M_{N-1}$" cap layer (block 241), and then patterning/etching the last aluminum layer using an etch process having an over-etch penetration depth that is less than the cap layer thickness of second-to-last "$M_{N-1}$" cap layer (block 243). Referring to FIG. 1, metallization layer M3 forms the last metallization layer of image sensor 100, and includes patterned aluminum layer 131-3 covered by uppermost/last ILD layer 133-3. In the manner described above, metallization layer 131-3 is formed by depositing aluminum on cap layer 135-2 of metallization layer M2, and then etching the aluminum layer to form aluminum metallization structures (e.g., aluminum wires 131-31 and 131-32) using an etch process that does not penetrate through cap layer 135-2. Referring to block 245 in FIG. 2, after the last patterned metal layer is completed, a last ILD (passivation dielectric) layer is formed (ILD layer 133-3 in FIG. 1), for example, by depositing a silicon oxy-nitride layer having a thickness in the range of 500 to 5000 A. As indicated in FIG. 1, there is no cap layer over last ILD (passivation dielectric) layer 133-3. Nevertheless, as indicated in block 247 (FIG. 2), in one embodiment a bake (anneal) at temperature in the range 350-450° C. is performed to decrease the amount of hydrogen in last ILD layer before pad etch. The purpose of this anneal is to shift the diffusion of residual hydrogen to the outside of the wafer. After formation of the uppermost/last ILD layer, pad etch is performed, and then back-end processing is completed by way of forming final contact structures according to known techniques (block 250).

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A semiconductor device comprising:
   a semiconductor substrate including one or more doped diffusion regions disposed below an upper substrate surface;
   a polycrystalline silicon structure disposed on the semiconductor substrate over the upper substrate surface;
   a pre-metal dielectric layer formed over the polycrystalline silicon structure; and
   a back-end metallization structure formed on the pre-metal dielectric layer, the back-end metallization structure including a plurality of metallization layers formed in a stack, each of the metallization layers including a patterned metal layer and a interlevel dielectric (ILD) layer formed over the patterned metal layer,
   wherein said ILD layer of each of said plurality of metallization layers comprises a TEOS-based oxide; and
   wherein at least one of the plurality of metallization layers includes a cap layer formed on an upper surface of the ILD layer, and
   wherein the cap layer of all of said plurality of metallization layers except an uppermost said metallization layer comprises a high-density low-moisture content oxide material having a minimum thickness of 100 A.

2. The semiconductor device of claim 1, wherein the high-density low-moisture content oxide material comprises at least one of silane oxide and silicon oxy-nitride having a minimum density of 2.2 g/cm$^3$ and a maximum moisture content of four atomic percent.

3. The semiconductor device of claim 1,
   wherein said patterned metal layer of each of said plurality of metallization layers comprises aluminum;
   wherein said ILD layer of said at least one metallization layer comprises one of Undoped silicate glass (USG) and Fluorosilicate glass (FGS); and
   wherein said cap layer of said at least one of said plurality of metallization layers comprises silane oxide.

4. The semiconductor device of claim 1,
   wherein the one or more doped diffusion regions include a source diffusion region and a drain diffusion region,
   wherein the polycrystalline silicon structure comprises a floating gate structure disposed on a gate oxide layer over a channel region located between the source and drain diffusion regions, and
   wherein a salicide structure is formed over at least one of said source diffusion region, said drain diffusion region, and said floating gate structure.

5. The semiconductor device of claim 1, wherein said semiconductor device comprises one of a non-volatile memory (NVM) array, a contact image sensor, a charge-coupled (CCD) device, and a CMOS-based imaging device.

6. The semiconductor device of claim 1,
   wherein the ILD layer of all of said plurality of metallization layers comprises TEOS-based oxide.

7. The semiconductor device of claim 1, further comprising an additional cap layer disposed between said pre-metal dielectric layer and a lowermost metallization layer of said metallization structure, wherein said additional cap layer comprises said high-density low-moisture content oxide.

8. The semiconductor device of claim 1, further comprising a barrier layer disposed between said polycrystalline silicon structure and a lowermost metallization layer of said metallization structure, wherein said barrier layer comprises one of silicon nitride and silicon oxy-nitride.

9. The semiconductor device of claim 1, wherein said cap layer comprises a silane oxide layer having a maximum thickness in the range of 500 A to 5000 A.

10. A semiconductor device comprising:
    a semiconductor substrate including one or more doped diffusion regions disposed below an upper substrate surface;
    a polycrystalline silicon structure disposed on the semiconductor substrate over the upper substrate surface;
    a pre-metal dielectric layer formed over the polycrystalline silicon structure; and
    a back-end metallization structure formed on the pre-metal dielectric layer, the back-end metallization structure including a plurality of metallization layers formed in a stack, each of the metallization layers including a patterned metal layer and a interlevel dielectric (ILD) layer formed over the patterned metal layer,
    wherein said ILD layer of each of said plurality of metallization layers comprises a TEOS-based oxide; and
    wherein at least one of the plurality of metallization layers includes a cap layer formed on an upper surface of the ILD layer,
    wherein the cap layer said at least one of said plurality of metallization layers comprises a high-density low-moisture content oxide material having a minimum thickness of 100 A,
    wherein said metallization structure includes a first metallization structure and a second metallization structure disposed on said first metallization structure;
    wherein a first said cap layer of said first metallization layer comprises a TEOS-based oxide, and
    wherein a second said cap layer of said second metallization layer comprises said high-density low-moisture content oxide.

* * * * *